(12) United States Patent
Konshak et al.

(10) Patent No.: US 7,626,820 B1
(45) Date of Patent: Dec. 1, 2009

(54) THERMAL TRANSFER TECHNIQUE USING HEAT PIPES WITH INTEGRAL RACK RAILS

(75) Inventors: Michael V. Konshak, Louisville, CO (US); Guoping Xu, San Diego, CA (US); Nicholas E. Aneshansley, San Diego, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 29 days.

(21) Appl. No.: 12/121,303

(22) Filed: May 15, 2008

(51) Int. Cl.
*H05K 7/20* (2006.01)
*F28F 1/00* (2006.01)

(52) U.S. Cl. ............... 361/700; 165/80.4; 165/104.33; 361/699; 361/701; 361/702

(58) Field of Classification Search .............. 361/700, 361/702
See application file for complete search history.

(56) References Cited

U.S. PATENT DOCUMENTS

| | | | |
|---|---|---|---|
| 6,055,157 A * | 4/2000 | Bartilson | 361/699 |
| 6,796,372 B2 * | 9/2004 | Bear | 165/104.21 |
| 6,836,407 B2 * | 12/2004 | Faneuf et al. | 361/679.49 |
| 7,012,807 B2 * | 3/2006 | Chu et al. | 361/699 |
| 7,013,955 B2 * | 3/2006 | Phillips et al. | 165/104.21 |
| 7,096,928 B2 * | 8/2006 | Phillips et al. | 165/104.21 |
| 7,345,877 B2 * | 3/2008 | Asfia et al. | 361/700 |
| 7,403,384 B2 * | 7/2008 | Pflueger | 361/688 |
| 2003/0010477 A1 * | 1/2003 | Khrustalev et al. | 165/104.33 |
| 2004/0045730 A1 * | 3/2004 | Garner | 174/16.3 |
| 2008/0013283 A1 * | 1/2008 | Gilbert et al. | 361/715 |
| 2008/0087406 A1 * | 4/2008 | Asfia et al. | 165/104.29 |
| 2008/0259566 A1 * | 10/2008 | Fried | 361/699 |

* cited by examiner

*Primary Examiner*—Gregory D Thompson
(74) *Attorney, Agent, or Firm*—Osha • Liang LLP

(57) ABSTRACT

A thermal transfer apparatus for cooling a heat-producing electronic component includes an evaporator disposed over the heat-producing electronic component and thermally coupled to the heat-producing electronic component, a plurality of heat pipes carrying a working fluid therein disposed over the evaporator and thermally coupled to the evaporator, a cold plate thermally coupled to a first end of the plurality of heat pipes, and a condenser thermally coupled to a second end of the plurality of heat pipes. The heat pipes extend over the evaporator such that the first end and the second end of the heat pipes couple to the cold plate and condenser at a location not over the heat-producing electronic component. The cold plate and the condenser are supplied with a coolant from outside the thermal transfer apparatus.

20 Claims, 8 Drawing Sheets

THERMAL TRANSFER TECHNIQUE USING HEAT PIPES WITH INTEGRAL RACK RAILS

BACKGROUND OF INVENTION

Heat generation by electronic components used, for example, in computer systems is a major issue of concern to industry. Reliability of electronic components such as semiconductor chips being a function of temperature necessitates removal of the generated heat from the electronic components with the aid of external means. The shrinking of electronic circuit sizes with increasing speed of processors has further lead to circuits having to be stacked one above the other with little space therebetween.

When space constraints and inefficient thermal cooling systems cause the heat density to rise above a tolerance limit in stacked circuits of computing systems, failure of components could occur resulting in loss of valuable data and prohibitive restorative expenditures. Thus, efficient and compact design of the external devices for evacuating heat away from the electronics is necessary.

Typical solutions involving heat pipes, as shown in Prior Art FIG. 1, include an evaporator plate 5 that absorbs heat from the electronic circuit 2 and evaporates a working fluid inside the heat pipes 6. The fluid is conveyed to a condenser 7 comprising a heat exchanger 8 cooled by a plurality of fins that condenses the fluid back to liquid form and conveys the fluid back to the evaporator 5. This process continues in a cycle. A pump 3 and a heat sink 4 are usually provided to supply a cooling liquid to the evaporator plate 5 and dissipate the heat absorbed therein, respectively. The circuits may additionally be cooled by forced air blown from cooling fans.

SUMMARY OF INVENTION

In general, in one or more aspects, the invention relates to a thermal transfer apparatus for compact cooling of electronic circuits. The thermal transfer apparatus comprises an evaporator disposed over a heat-producing electronic component and thermally coupled to the heat-producing electronic component, a plurality of heat pipes carrying a working fluid therein disposed over the evaporator and thermally coupled to the evaporator, a cold plate thermally coupled to a first end of the heat pipes, and a condenser thermally coupled to a second end of the heat pipes. The two ends of the heat pipes couple to the cold plate and condenser, and the cold plate and the condenser are supplied with a coolant from outside the thermal transfer apparatus.

In one or more embodiments, a plurality of the thermal transfer apparatus is part of a tray, where a plurality of such trays is attached to vertical racks onto rails through a connecting section.

In one or more embodiments, the thermal transfer apparatus comprises vertical cold plates.

In one or more embodiments, the thermal transfer apparatus comprises removable cold plates coupled onto a rod with an operating lever to compress the cold plates on to a compression pan.

Other aspects and alternative useful embodiments of the invention will be apparent from the following description and the appended claims.

DETAILED DESCRIPTION

Figure 1:
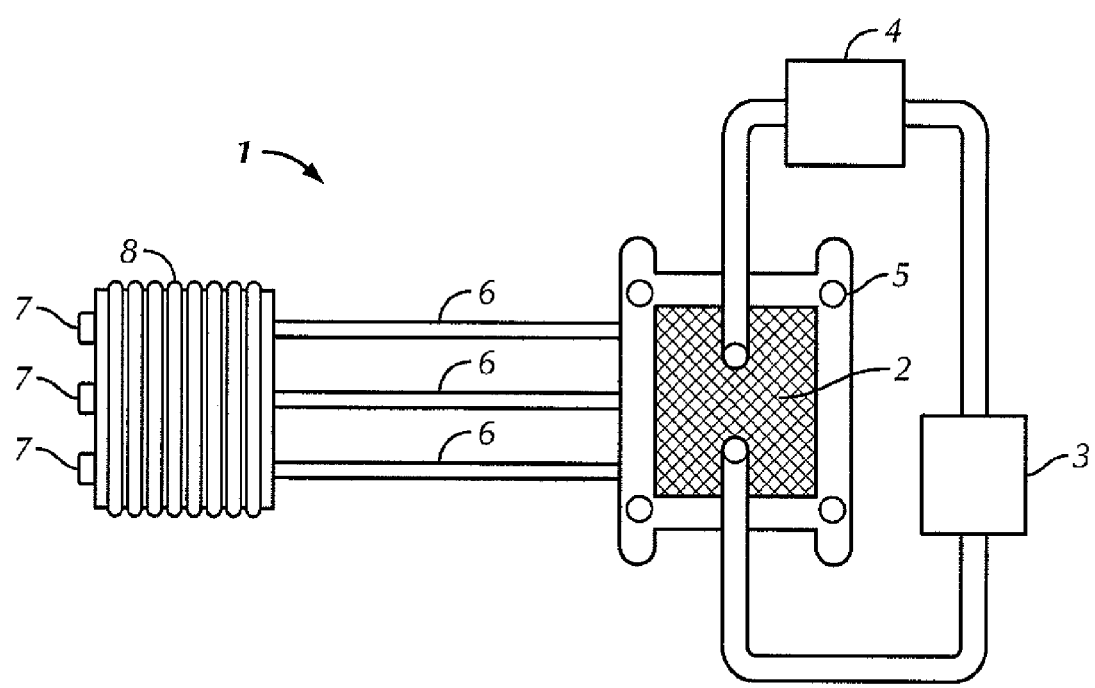
FIG. 1 is a top view of a prior art thermal transfer apparatus.

Various exemplary embodiments of the invention will now be described with reference to the accompanying figures. Like elements are referred to by like reference numerals in the several views for the sake of clarity.

Figure 2:
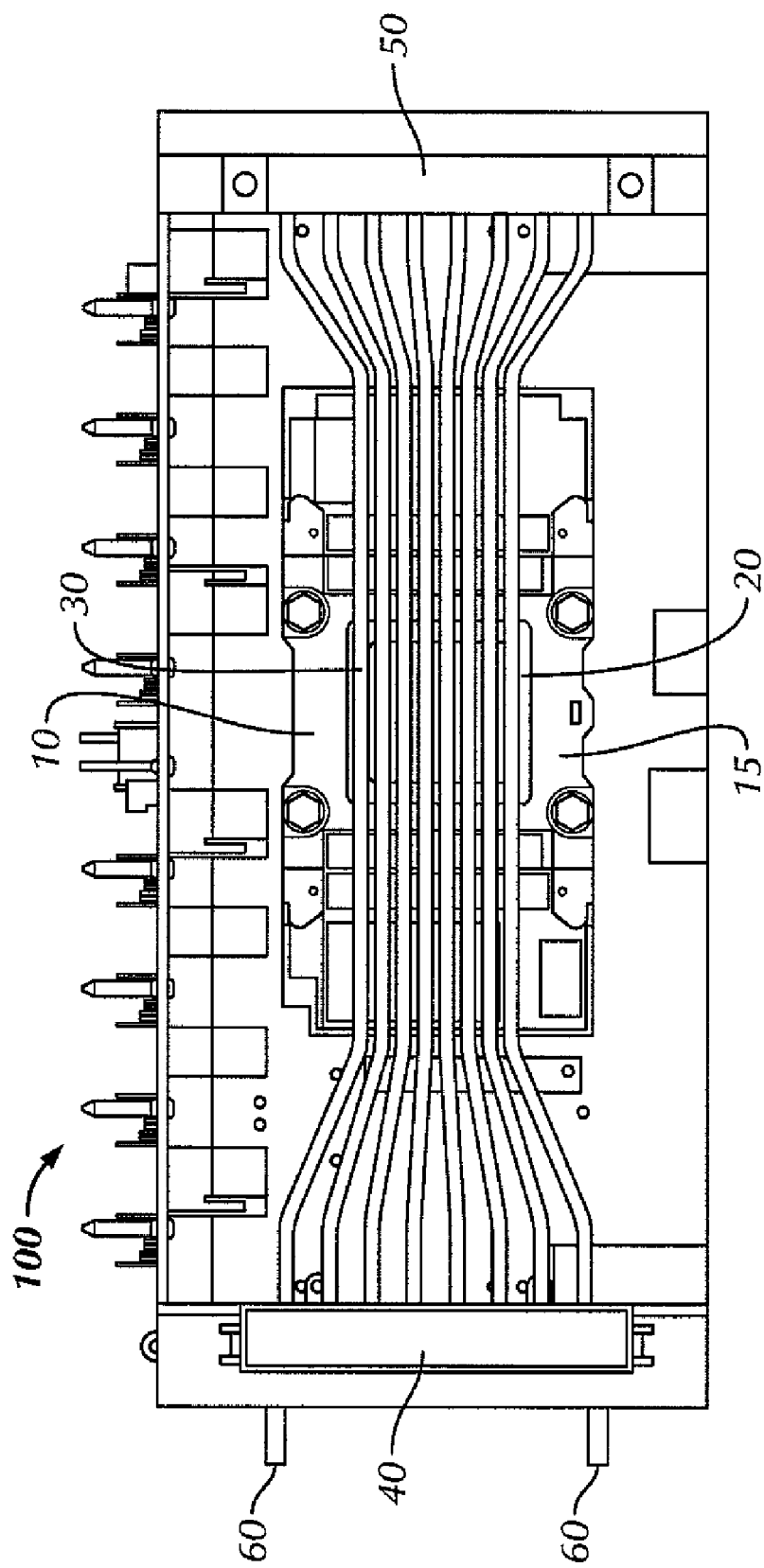
FIG. 2 is a top view of a thermal transfer apparatus according to the present invention.

Referring to FIG. 2, in accordance with one or more embodiments of the invention, a thermal transfer apparatus 100 comprises of an evaporator 10 with a source cold plate 15 disposed over a heat-producing electronic circuit 20 and thermally coupled thereof. An array of heat pipes 30 carrying a working fluid inside is disposed over the evaporator 10 and thermally coupled thereto. The heat pipes 30 extend from an end comprising a cold plate 40 to an end comprising a condenser 50 over the evaporator 10, and the coolant supply lines 60 to the cold plate 40 and the condenser 50 are outside the thermal transfer apparatus 100. Because of this, leakage of coolant inside the apparatus is prevented.

Figure 3:
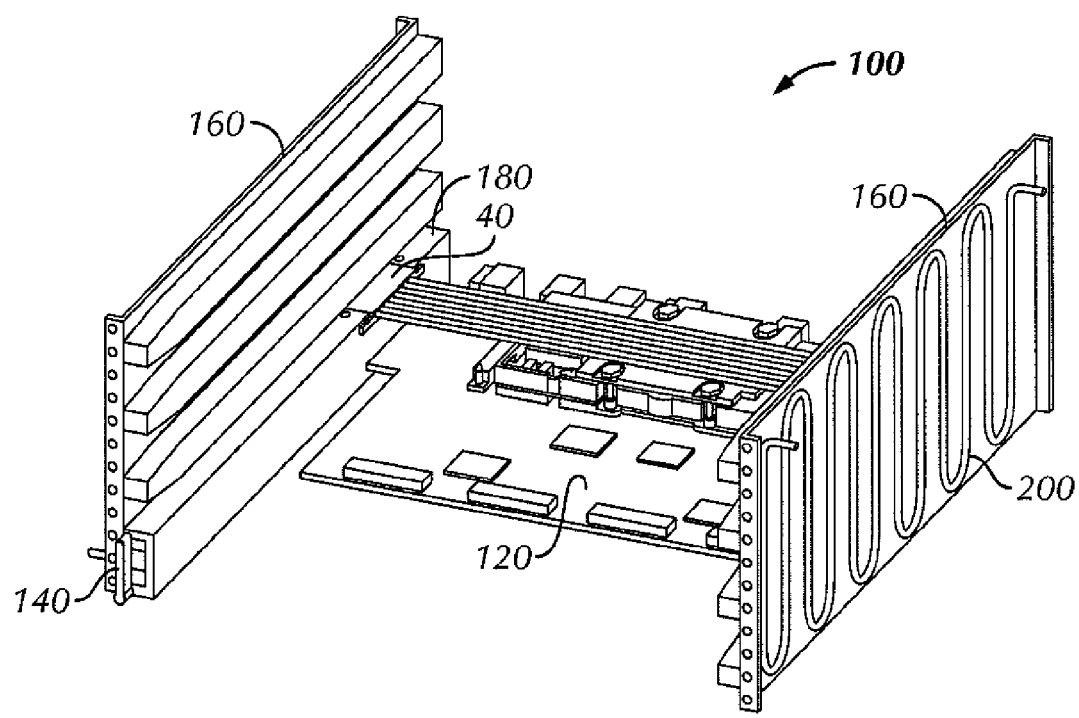
FIG. 3 is a perspective view of the thermal transfer apparatus as being part of a rack-tray mechanism.

FIG. 3 shows the thermal transfer apparatus 100 as part of a tray 120 that is attached to a rail 140 of one of two vertical racks 160 via a connecting section 180 on the side of the cold plate 40. The condenser 50 side of the apparatus 100 is attached to a vertical rack 160 that has a heat exchanger 200 coupled thereto. This heat-exchanger 200 comprises a piping system that may be, for example, interwoven for efficient heat exchange. One of ordinary skill in the art will appreciate that other shapes of the piping system, tray 120, and rack 160 configurations could be employed depending on application. In one or more embodiments, a thermal transfer apparatus 100 comprising multiple electronic circuits 20, each having their own evaporators 10, may also be employed. Further, several thermal transfer apparatus 100 could be arranged along a tray 120, and likewise several trays 120 stacked one over the other, and connected between the two vertical racks 160.

Figure 4:
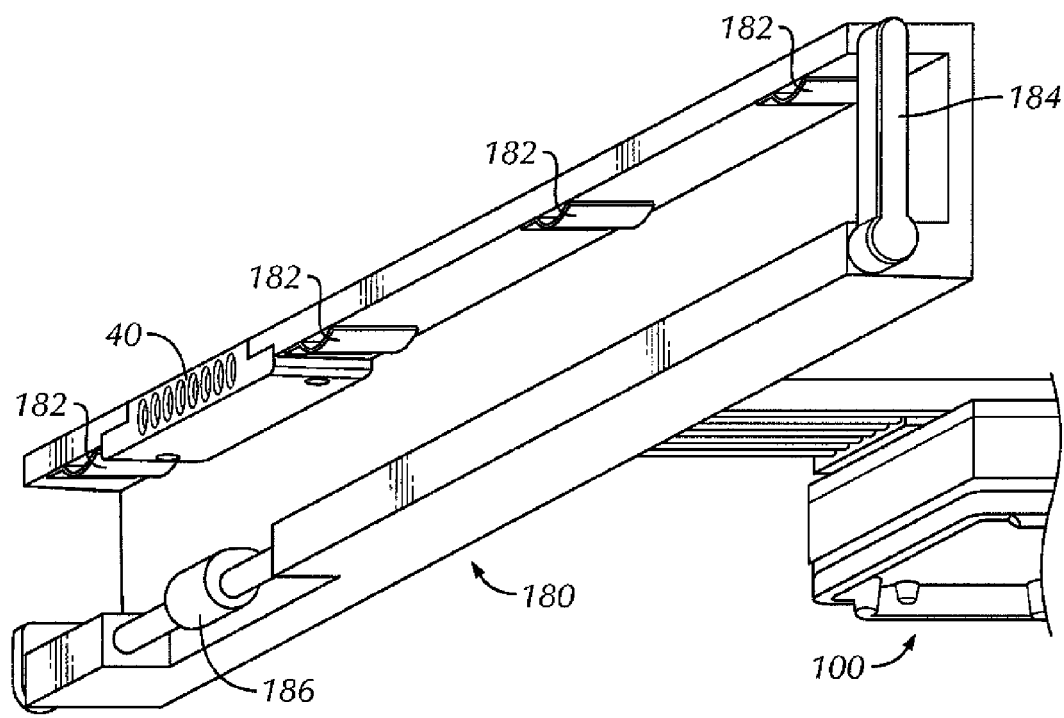
FIG. 4 is a perspective view of the connecting section of the thermal transfer apparatus.

FIG. 4 is a perspective view of the connecting section 180 used to connect a cold plate 40 of a thermal transfer apparatus 100 to a rail 140 of a vertical rack 160. The connecting section 180 has an appropriate structure in order to convenience the locking of the section 180 to the rail 140. The cold plate 40 is shown in a stationary state. Contacts between individual cold plates 40 during insertion of trays 120 are prevented through the provision of flexible glide springs 182 that are curved in shape between adjacent cold plates 40. A compression lever 184 perpendicular to the plane of the thermal transfer apparatus 100 is provided to operate in conjunction with a compression cam 186, a roller on a rod mechanism, in order to facilitate clutching and guidance of a tray onto the connecting section 180 and the rail 140. Upon angular rotation of the compression lever 184, the compression cam 186 moves accordingly to engage the cold plate.

Figure 5:
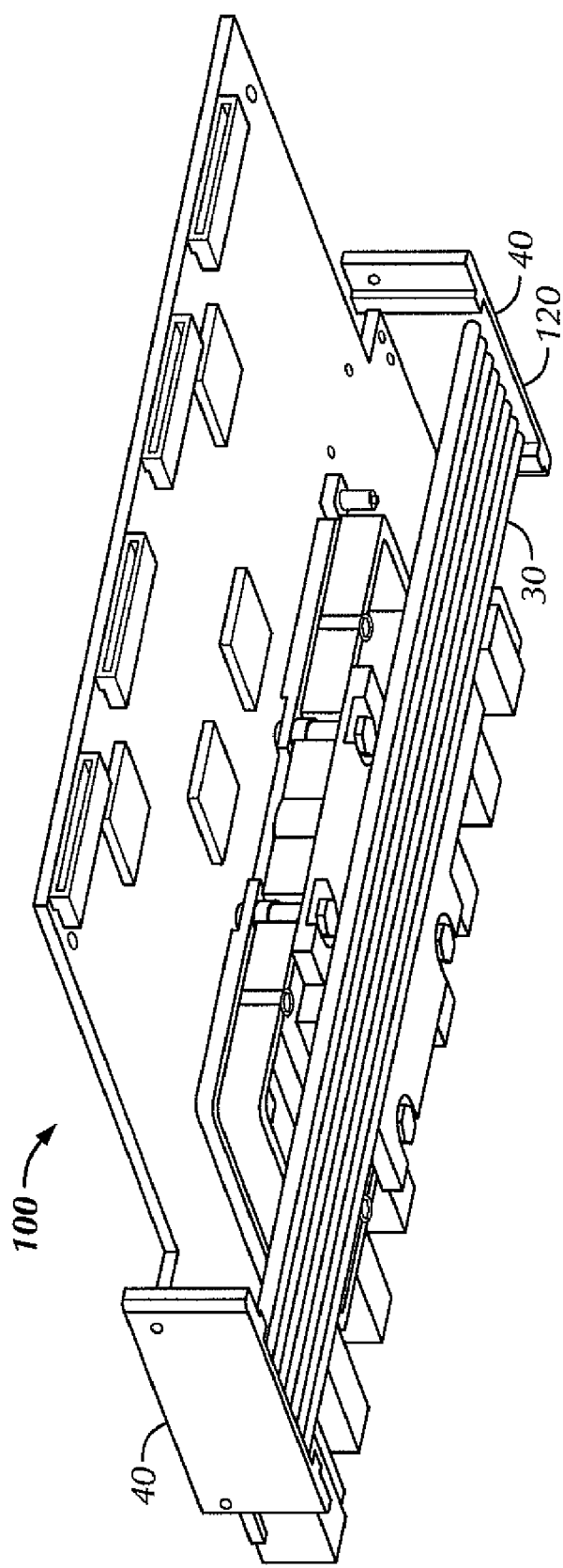
FIG. 5 is a perspective view of the thermal transfer apparatus in accordance with another embodiment of the invention where the cold plates are vertical.

According to another embodiment of the invention, as shown in FIG. 5, the cold plates 40 of the thermal transfer apparatus 100 are vertical in a direction perpendicular to the tray 120, and the heat pipes 30 are disposed below the electronic circuits 20.

Figure 6:
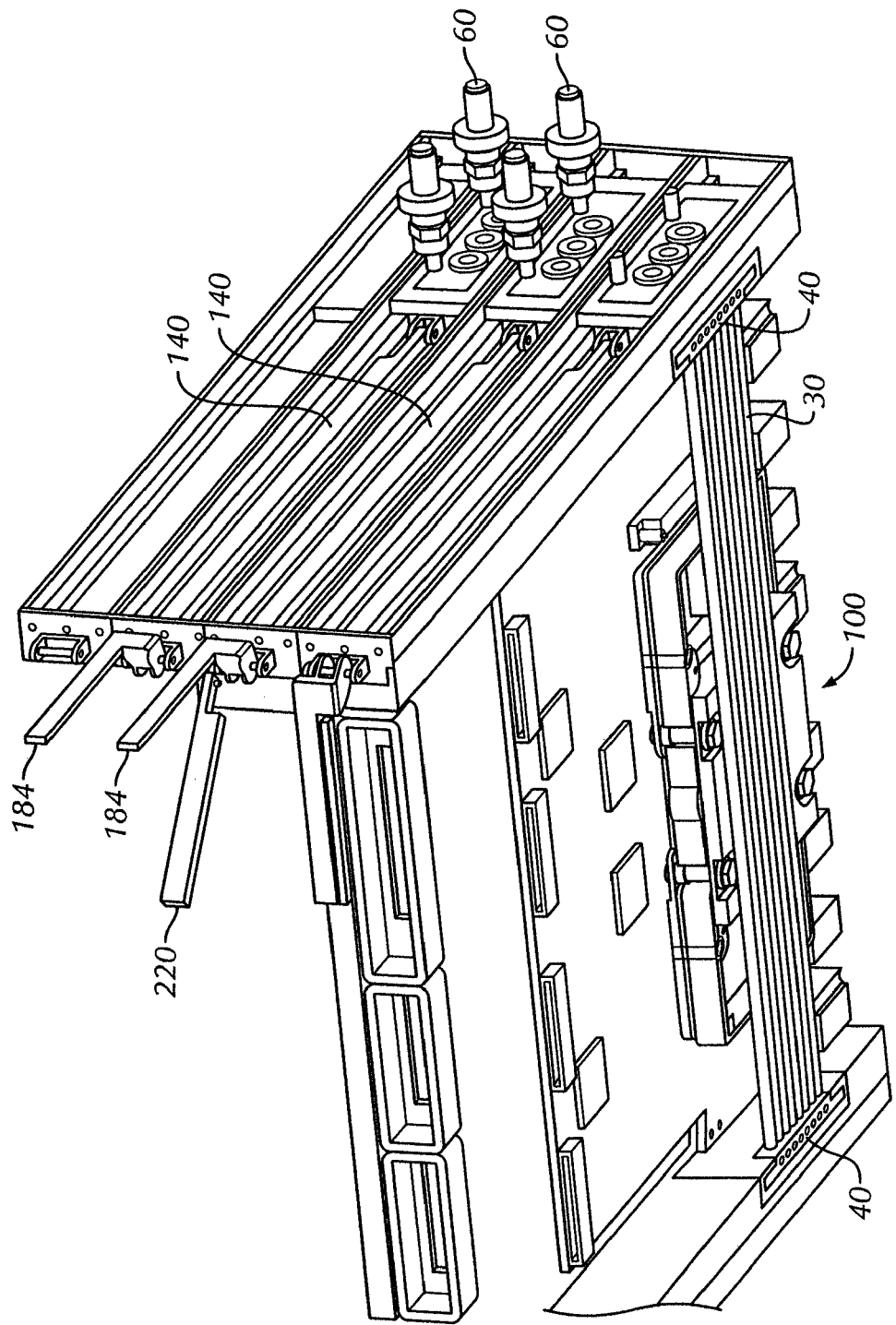
FIG. 6 is a perspective view of the thermal transfer apparatus in accordance with the embodiment shown in FIG. 6 as a part of a rack-tray mechanism with individual rails provided on racks.

FIG. 6 shows a vertical cold plate 40 arrangement of the thermal transfer apparatus 100 in accordance with one or more embodiments of the present invention. In one or more embodiments, the rails 140 may be 1U (1.75") in height. The individual rails 140 are easy to disconnect quickly and eject levers 220 covered by clutch compression 184 levers are provided for sequential operation. FIG. 6 also shows coolant lines 60 for coolant supply from an outside of the thermal transfer apparatus 100. The coolant lines 60 could be coupled to a central coolant supply station in the room. Those skilled in the art will appreciate that other possible eject lever 220 mechanisms may be employed in one or more embodiments of the invention. Additionally, in one or more embodiments, the heat pipes 30 may be fanned on the side.

Figure 7:
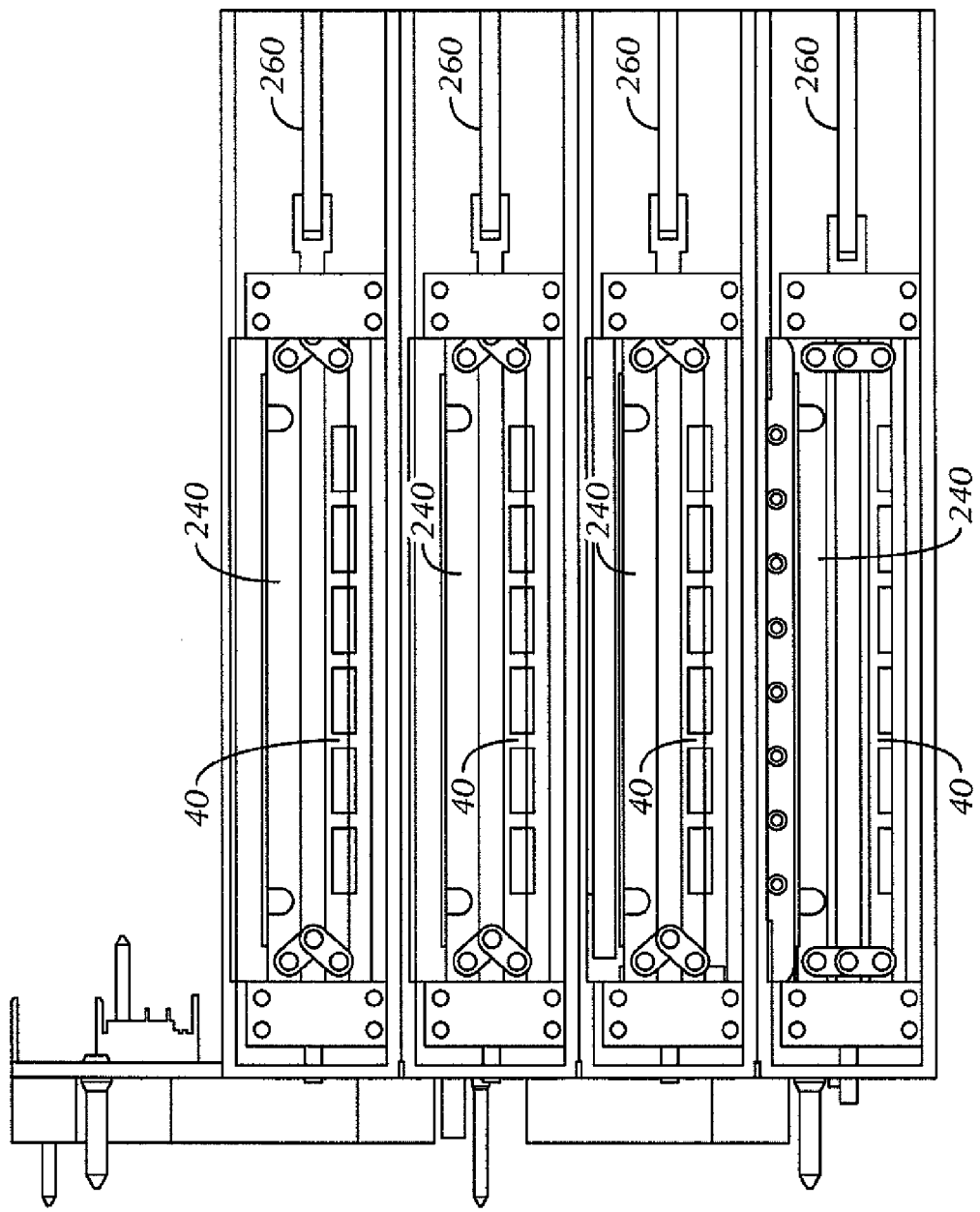
FIG. 7 is a front view of the cold plates of the thermal transfer apparatus where the cold plates rest in compression pans.

FIG. 7 shows a cold plate 40 configuration where the cold plate 40 rests in a compression pan 240 and is removable. In one or more embodiments, at least one cold plate 40 is coupled to a rod 260 that holds the cold plate 40 in a compressed state in the compression pan 240.

Figure 8:
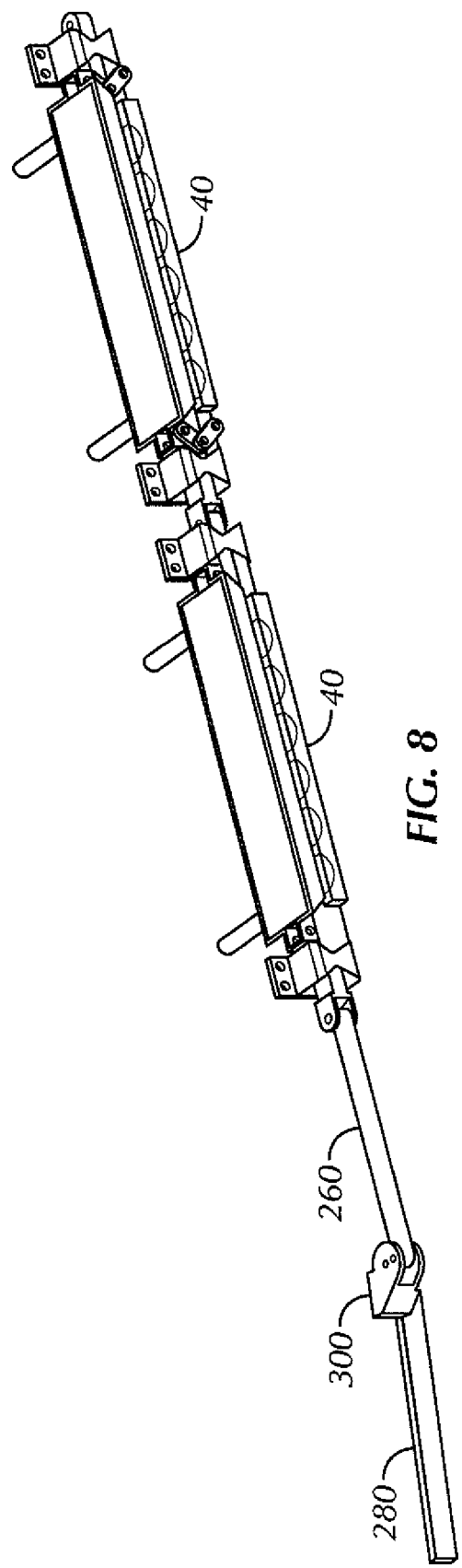
FIG. 8 is a perspective view of a serially connected cold plate mechanism for covering multiple heat sources, i.e., electronic circuits within a tray.

FIG. 8 shows two cold plates 40 coupled onto a rod 260 comprising an operator lever 280 at one end. The operator lever 280 is fixed to a focal point 300 attached to an interface at the compression lever end as described with regard to FIG. 6. The rod 260 containing the cold plates 40 is rotatable around the focal point 300 upon application of pressure at the operator lever 280, thereby forcing the cold plates 40 to dislodge from the compression pan 240 and become disconnected. The serial connection mechanism, in which at least one cold plate 40 is compressed onto the compression pan 240, allows for easy coverage of multiple heat-sources, e.g., circuits within a tray.

Advantages of the invention include one or more of the following. In accordance with embodiments of the invention, coolant supply is from outside the thermal transfer apparatus 100, thereby preventing unwanted coolant leaks inside the apparatus and the trays. The 1U height of rails 140 (1.75") provides for reduced headroom for heat pipes 30 and therefore, heat evacuation from stacked circuits could be accomplished in a compact manner. The removable interfacing between racks 160 and trays 120 allows for the cooling operation without the need to disconnect constituent parts of an individual thermal transfer apparatus 100. Contact between cold plates 40 is also avoided. Serially connected cold plates 40 provide coverage for multiple electronic circuits 20 within a tray 120, with the rack-tray mating providing for enlarged contact area, wider frame enclosure, and rolling elements for easy connect/disconnect mechanisms. The mechanism of clamping and releasing cold plates 40 being in a compressed state allows for convenience in sliding out or connecting the highly conductive interface.

While the invention has been described with respect to a limited number of exemplary embodiments, the invention is not limited. Those of ordinary skill in the art will recognize that various modifications to the embodiments shown may be made without departing from the scope of the invention. Accordingly, the invention shall be considered limited only by the scope of the appended claims.

What is claimed is:

1. A thermal transfer apparatus for cooling a heat-producing electronic component comprising:
   an evaporator disposed over the heat-producing electronic component and thermally coupled to the heat-producing electronic component;
   a plurality of heat pipes carrying a working fluid therein disposed over the evaporator and thermally coupled to the evaporator;
   a cold plate thermally coupled to a first end of the plurality of heat pipes;
   a condenser thermally coupled to a second end of the plurality of heat pipes;
   wherein the heat pipes extend over the evaporator such that the first end and the second end of the heat pipes couple to the cold plate and condenser at a location not over the heat-producing electronic component, and
   wherein the cold plate and the condenser are supplied with a coolant from outside the thermal transfer apparatus.

2. The thermal transfer apparatus of claim 1, wherein the heat pipes are spaced apart thereof uniformly in a direction perpendicular to a longitudinal extension of the heat pipes.

3. The thermal transfer apparatus of claim 1, wherein a width of the plurality of heat pipes is narrow proximate the evaporator and wide proximate the condenser and cold plate.

4. The thermal transfer apparatus of claim 1, further comprising:
   a tray;
      wherein at least one of the thermal transfer apparatus is part of the tray; and
      wherein the thermal transfer apparatus is in a plane of the tray.

5. The thermal transfer apparatus of claim 4, wherein the tray is connected between two vertical racks.

6. The thermal transfer apparatus of claim 5, wherein a plurality of the trays are parallel thereof in a vertical direction of the two racks.

7. The thermal transfer apparatus of claim 6, further comprising
   a connecting section configured to connect each tray and each cold plate to each vertical rack;
   the connecting section comprising:
      a glide spring configured to be placed between two cold plates of two adjacent thermal transfer apparatus such that no contact occurs between the two cold plates during insertion of the tray; and
      a cam-operated compression lever configured to operate a cam configured to guide the tray onto the rack.

8. The thermal transfer apparatus of claim 7, wherein the cold plates are fixed.

9. The thermal transfer apparatus of claim 7, wherein the cam-operated compression lever is perpendicular to a direction of each tray.

10. The thermal transfer apparatus of claim 7, wherein the cold plates are in a vertical direction of the two racks.

11. The thermal transfer apparatus of claim 7, wherein the connecting section is held on to a rack rail on each vertical rack.

12. The thermal transfer apparatus of claim 11, wherein a plurality of rack rails are arranged in a direction perpendicular to a direction of the trays.

13. The thermal transfer apparatus of claim 12, wherein at the side of the second end of the plurality of heat pipes, the tray is connected to a rack, said rack being coupled thermally to an integrated heat exchanger pipe system to remove heat from the condenser side.

14. The thermal transfer apparatus of claim 12, wherein at least one rail is 1U in height.

15. The thermal transfer apparatus of claim 12, wherein a rail has an eject lever configured to couple with the compression lever for sequential operation.

16. The thermal transfer apparatus of claim 12, wherein the cold plates are removable.

17. The thermal transfer apparatus of claim 12, wherein the plurality of heat-pipes are fanned.

18. The thermal transfer apparatus of claim 13, wherein the integrated heat exchanger pipe system comprises interwoven heat pipes.

19. A disconnect mechanism in a thermal transfer apparatus for cooling heat producing electronic components comprising:
- at least one thermal transfer apparatus comprising:
  - an evaporator disposed over a heat-producing electronic component and thermally coupled to the heat-producing electronic component;
  - a plurality of heat pipes carrying a working fluid therein disposed over the evaporator and thermally coupled to the evaporator;
  - a removable cold plate thermally coupled to a first end of the plurality of heat pipes; and
  - a condenser thermally coupled to a second end of the plurality of heat pipes;
- at least one tray comprising the at least one thermal transfer apparatus;
- a vertical rack configured to receive said at least one tray;
- at least one rack rail on said vertical rack configured to hold the at least one tray onto the rack;
- at least one connecting section configured to guide the at least one tray onto the rack via the at least one rack rail;
- a rod attached to an end of the at least one rack rail and configured to be coupled to the cold plate;
- a compression pan configured to receive the cold plate; and
- an operator lever at the end of the at least one rack rail, and wherein upon application of pressure to the operator lever, the cold plate is ejected out of the compression pan.

20. A method for transferring heat away from an electronic component comprising:
- thermally coupling an evaporator to an electronic component;
- thermally coupling a plurality of heat pipes carrying a working fluid therein, with a condenser in communication with a first end of the plurality of heat pipes, and a cold plate in connection with a second end of the plurality of heat pipes; and
- cooling the electronic component by establishing a working fluid flow cycle of evaporation at the evaporator and condensation at the condenser;
- wherein the heat pipes extend over the evaporator such that the first end and the second end of the heat pipes couple to the cold plate and condenser at a location not over the heat-producing electronic component.

* * * * *